(12) United States Patent  
Yao et al.

(10) Patent No.: US 8,350,216 B2
(45) Date of Patent: Jan. 8, 2013

(54) MINIATURIZED OPTICAL PROXIMITY SENSOR

(75) Inventors: Yufeng Yao, Singapore (SG); Chi Boon Ong, Singapore (SG); Wee Sin Tan, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 343 days.

(21) Appl. No.: 12/631,804

(22) Filed: Dec. 4, 2009

(65) Prior Publication Data
US 2011/0057104 A1 Mar. 10, 2011

Related U.S. Application Data

(63) Continuation-in-part of application No. 12/557,516, filed on Sep. 10, 2009, now Pat. No. 8,143,608.

(51) Int. Cl.
*G01J 5/02* (2006.01)
(52) U.S. Cl. .................................. 250/339.01
(58) Field of Classification Search .............. 250/339.01
See application file for complete search history.

(56) References Cited

U.S. PATENT DOCUMENTS

| | | | |
|---|---|---|---|
| 5,155,777 A | 10/1992 | Angelopoulos et al. |
| 5,367,393 A | 11/1994 | Ohara et al. |
| 5,675,143 A | 10/1997 | Heimlicher |
| 6,064,062 A | 5/2000 | Bohn |
| 6,135,816 A | 10/2000 | Mashiyama |
| 6,364,706 B1 | 4/2002 | Ando et al. |
| 6,572,410 B1 | 6/2003 | Volstorf et al. |
| 6,635,955 B2 | 10/2003 | Scheidle |
| 6,674,653 B1 | 1/2004 | Valentine |
| 6,885,300 B1 | 4/2005 | Johnston et al. |
| 7,026,710 B2 | 4/2006 | Coyle et al. |
| 7,172,126 B2 | 2/2007 | Schmidt et al. |
| 7,229,295 B2 | 6/2007 | Ice et al. |
| 7,256,483 B2 | 8/2007 | Eppler et al. |
| 7,258,264 B2 | 8/2007 | Ice et al. |
| 7,277,012 B2 | 10/2007 | Johnston et al. |
| 7,289,142 B2 | 10/2007 | Silverbrook |
| 7,387,033 B2 | 6/2008 | Qing et al. |
| 7,387,907 B2 | 6/2008 | Hsu et al. |
| 7,427,806 B2 | 9/2008 | Arndt et al. |

(Continued)

FOREIGN PATENT DOCUMENTS
EP 1455564 9/2004
(Continued)

OTHER PUBLICATIONS

"Avago Technologies Aniunces Ultra-Thin Integrated Ambient Light and Proximity Sensor Module for Use in Moblie Phones," Wireless Design and Development, Nov. 27, 2009.

(Continued)

*Primary Examiner* — David Porta
*Assistant Examiner* — Hugh H Maupin

(57) ABSTRACT

Various embodiments of a miniaturized optical proximity sensor are disclosed. In one embodiment, an ambient light sensor and a light detector are mounted on first and second spacers, which in turn are mounted to a top surface of an integrated circuit die-attached to a substrate. An optically-transmissive infrared pass compound is molded over the ambient light sensor, the light detector, the integrated circuit, a light emitter and peripheral portions of the substrate. Next, an optically non-transmissive infrared cut compound is molded over the optically-transmissive infrared pass compound to provide a miniaturized optical proximity sensor having no metal shield but exhibiting very low crosstalk characteristics.

28 Claims, 8 Drawing Sheets

U.S. PATENT DOCUMENTS

| | | |
|---|---|---|
| 7,510,888 B2 | 3/2009 | Guenther et al. |
| 7,514,666 B2 | 4/2009 | Yee et al. |
| 7,582,513 B2 | 9/2009 | Kroeninger et al. |
| 7,675,132 B2 | 3/2010 | Waitl et al. |
| 7,767,485 B2 | 8/2010 | Ogawa et al. |
| 7,851,246 B2 * | 12/2010 | Camacho et al. ............... 438/51 |
| 2002/0172472 A1 | 11/2002 | Nelson et al. |
| 2004/0065894 A1 | 4/2004 | Hashimoto et al. |
| 2005/0088900 A1 * | 4/2005 | Chan et al. .................... 365/222 |
| 2005/0110157 A1 | 5/2005 | Sherrer et al. |
| 2006/0016994 A1 | 1/2006 | Basoor et al. |
| 2006/0022212 A1 | 2/2006 | Waitl et al. |
| 2007/0045524 A1 | 3/2007 | Rains et al. |
| 2007/0072321 A1 | 3/2007 | Sherrer et al. |
| 2008/0006762 A1 | 1/2008 | Fadell et al. |
| 2008/0011939 A1 | 1/2008 | Yee et al. |
| 2008/0011940 A1 | 1/2008 | Zhang et al. |
| 2008/0012033 A1 | 1/2008 | Arndt |
| 2008/0049210 A1 | 2/2008 | Takaoka |
| 2008/0116379 A1 | 5/2008 | Teder |
| 2008/0118241 A1 | 5/2008 | TeKolste et al. |
| 2008/0165115 A1 | 7/2008 | Herz et al. |
| 2008/0173963 A1 | 7/2008 | Hsu et al. |
| 2008/0197376 A1 | 8/2008 | Bert et al. |
| 2008/0265266 A1 | 10/2008 | Bogner et al. |
| 2008/0296478 A1 | 12/2008 | Hernoult |
| 2008/0308738 A1 | 12/2008 | Li et al. |
| 2008/0308917 A1 | 12/2008 | Pressel et al. |
| 2009/0027652 A1 | 1/2009 | Chang et al. |
| 2009/0129783 A1 | 5/2009 | Ori et al. |
| 2009/0159900 A1 | 6/2009 | Basoor et al. |
| 2009/0168088 A1 | 7/2009 | Rosenblatt |
| 2009/0267173 A1 | 10/2009 | Takahashi et al. |
| 2010/0030039 A1 | 2/2010 | Lamego et al. |
| 2010/0246771 A1 | 9/2010 | Hawver et al. |
| 2010/0282951 A1 | 11/2010 | Costello et al. |
| 2010/0327164 A1 | 12/2010 | Costello et al. |
| 2011/0057102 A1 * | 3/2011 | Yao ............................. 250/338.1 |
| 2011/0057104 A1 | 3/2011 | Yao et al. |

FOREIGN PATENT DOCUMENTS

| | | |
|---|---|---|
| WO | WO2009072786 | 6/2009 |

OTHER PUBLICATIONS

Agilent HSDL-D100 Miniature Surface-Mount Proximity Sensor Data Sheet, Dec. 21, 2007.

Avago Technologies, "APDS-9005 Miniature Surface-Mount Ambient Light Photo Sensor", Jan. 2007.

Avago Technologies, "APDS-9101—Integrated Reflective Sensor", *Data Sheet* 2007.

Avago Technologies, "APDS-9700 Signal Conditioning IC for Optical Proximity Sensors", Jan. 4, 2008.

Avago Technologies, , "HSDL-9100—Surface-Mount Proximity Sensor", *Data Sheet* 2006.

Avago Technologies, "Integrated Ambinet Light and Proximity Sensor Prelim Datasheet", APDS-9800 Mar. 2, 2009.

Avago Technologies, "Integrated Optical Proximity Sensors Prelim Datasheet", APDS-9120 Feb. 25, 2009.

Costello, et al., "U.S. Appl. No. 12/495,739", *Optical Proximity Sensor Package with Molded Infrared Light Rejection Barrier and Infrared Pass Components* Jun. 30, 2009.

AZ Optics, "Device Debuts as the World's Best-Performing Integrated Light/Proximity Sensor", Nov. 11, 2008.

Ishihara, et al., "A Dual Face Package Using a Post with Wire Components: Novel Structure for PoP Wafer Level CSP and Compact Image Sensor Package", *Electronic Components and Technology Conference* 2008 , 1093-1098.

Khamal, Ibrahim , "Infra-Red Proiximilty Sensor (II)", Apr. 4, 2008.

Losee, et al., "A 1/3 Format Image Sensor with Refractory Metal Light Shield for Color Video Applications", *Solid State Circuits Conference, Digest of Technical Papers, 36th ISSCC, IEEE International Volume.* Feb. 1989, 90-91.

Nitto Denko Corporation, "Technical Data Sheet", NT-8506 2001.

Nitto Denko Corporation, "Technical Data Sheet", NT-MB-IRL3801.

Penchem Technologies Data Sheet, "PEMCHEM OP 580", *IR Filter Optoelectronic Epoxy* Apr. 2009.

Penchem Technologies Data Sheet, "PENCHEM Op 579", *IR Pass Optoelectronic Epoxy* Apr. 2009.

Tan, et al., "U.S. Appl. No. 12/623,767", *Infrared Proximity Sensor Package with Improved Crosstalk Isolation*, filed Nov. 23, 2009, 30 pages.

Tyntek, "Data Sheet for AlGaAs/GaAs Infrared Chip", TK115IRA Nov. 2006.

Tyntek, "Data Sheet for AlGaAs/GaAs Infrared Chip", TK 1141RA Mar. 2004.

Tyntek, "Si Photo-Diode Chip—TK043PD Data Sheet", Dec. 19, 2007.

Xydar, "G-930—Solvay Advanced Polymers—Liquid Crystal Polymer Data Sheet", reproduced from website at www.ides.com/grades/ds/E22219.htm on Dec. 17,2007.

\* cited by examiner

MINIATURIZED OPTICAL PROXIMITY SENSOR

RELATED APPLICATION

This patent application is a continuation-in-part of U.S. patent application Ser. No. 12/557,516 filed Sep. 10, 2009 entitled "Package-on-Package (POP) Optical Proximity Sensor" to Yufeng Yao et al. (hereafter "the '516 patent application"), issued as U.S. Pat. No. 8,143,608, and claims priority and other benefits therefrom. The '516 patent application is hereby incorporated by reference herein in its entirety.

FIELD OF THE INVENTION

Various embodiments of the inventions described herein relate to the field of proximity sensors, and components, devices, systems and methods associated therewith.

BACKGROUND

Optical proximity sensors, such as the AVAGO TECHNOLOGIES™ HSDL-9100 surface-mount proximity sensor, the AVAGO TECHNOLOGIES™ APDS-9101 integrated reflective sensor, the AVAGO TECHNOLOGIES™ APDS-9120 integrated optical proximity sensor, and the AVAGO TECHNOLOGIES™ APDS-9800 integrated ambient light and proximity sensor, are known in the art. Such sensors typically comprise an integrated high efficiency infrared emitter or light source and a corresponding photodiode or light detector, and are employed in a large number of handheld electronic devices such as mobile phones, Personal Data Assistants ("PDAs"), laptop and portable computers, portable and handheld devices, amusement and vending machines, industrial automation machinery and equipment, contactless switches, sanitary automation machinery and equipment, and the like.

Referring to FIG. 1, there is shown a prior art optical proximity sensor 10 comprising infrared light emitter 16, light emitter driving circuit 51, light detector or photodiode 12, light detector sensing circuit 53, metal housing or shield 18 with apertures 52 and 54, and object to be sensed 60. Light rays 15 emitted by emitter 16 and reflected as light rays 19 from object 60 (which is in relatively close proximity to optical proximity sensor 10) are detected by photodiode 12 and thereby provide an indication that object 60 is close or near to sensor 10.

As further shown in FIG. 1; optical proximity sensor 10 further comprises metal housing or shield 18 formed of metal and comprising apertures 52 and 54 located over light emitter 16 and light detector 12, respectively, such that at least a first portion of light 15 emitted by light detector 12 passes through aperture 52, and at least a second portion of the first portion 19 of light reflected from object 60 in proximity to sensor 10 passes through aperture 54 for detection by light detector 12. As shown, metal housing or shield 18 may further comprise first and second modules 61 and 63 within which light emitter 16 and light detector 12 are disposed, respectively. The first and second modules 61 and 63 comprise adjoining optically opaque metal inner sidewalls 25 to provide optical isolation between first and second modules 61 and 63. Many optical proximity sensors generally include a metal shield, such as shield or housing 18 of the type shown in FIG. 1, to provide optical isolation between light emitter 16 and light detector or photodiode 12 so that undesired optical cross-talk between emitter 16 and detector 12 is minimized.

FIG. 2 shows a prior art optical proximity sensor 10 with a more complicated metal shield or housing 18 than that of FIG. 1. The optical proximity sensor shown in FIG. 2 is an AVAGO TECHNOLOGIES™ APDS-9800 Integrated Ambient Light and Proximity Sensor, which contains a printed circuit board ("PCB") substrate 11 upon which are mounted LED 16, light detector or photodiode 12, and ambient light sensor 14. The two-piece metal shield 18 covers LED 16, light detector or photodiode 12, and ambient light sensor 14 and contains a downwardly projecting light barrier 25 disposed therebetween. In the APDS-9800 optical proximity sensor, metal shield 18, being of a considerably more complicated shape and geometry than that of FIG. 12, is formed and thinned using progressive metal stamping techniques, and must be hand-fitted and attached to the underlying PCB by gluing to ensure proper alignment and fit.

As will now be seen, at least some optical proximity sensors of the prior art rely upon the use of an externally mounted metal shield 18, which is required to reduce the amount of crosstalk or interference that might otherwise occur between LED 16 and light detector 12, as well as to help increase the detection distance of the device. Metal shields 18 are quite small, however, making them difficult to manufacture in high volumes, and thus expensive to fabricate. Such metal shields 18 also generally require expensive automated equipment to attach same to sensors 10 in a mass production setting. Moreover, the quality of metal shields 18 often varies, and issues can arise with suppliers being unable to meet the tight dimensional tolerances required for such small devices. Metal shields 18 can also detach from sensor 10, thereby adding another failure point for sensor 10.

In addition, the commercial marketplace demands ever smaller portable electronic devices. This of course means there exists a strong motivation to make optical proximity sensors ever smaller. As optical proximity sensors become smaller, it becomes increasingly difficult to manufacture and attach the aforementioned metal shields to the sensors in a mass production setting. The metal shields themselves also add to the bulk and volume of the resulting sensor or package.

What is needed is an optical proximity sensor design that eliminates the need to include a metal shield 18, but which retains high crosstalk and interference rejection characteristics so that an optical proximity sensor can be provided that features improved performance, lower cost, increased manufacturability and improved reliability. What is also needed is a smaller optical proximity sensor.

SUMMARY

In some embodiments, there is provided an optical proximity sensor comprising a substrate having a plurality of wire bond pads, an infrared light emitter mounted atop the substrate and electrically connected to at least one of the wire bond pads, a light detector mounted atop the substrate and electrically connected to at least one of the wire bond pads, an integrated circuit mounted atop the substrate, the integrated circuit comprising light emitter driving and light detecting circuits operably connected to the light emitter and the light detector, respectively, the integrated circuit being operably connected to some of the plurality of wire bond pads, at least one spacer comprising an electrically non-conductive dielectric material, the spacer being mounted to a top surface of the integrated circuit, an ambient light sensor mounted to a top surface of the spacer, the ambient light sensor being electrically connected to at least one of the wire bond pads, a light detector mounted to the top surface of the spacer, the light detector being electrically connected to at least one of the wire bond pads, a first molded infrared light pass component disposed over and covering the light emitter, a second molded infrared light pass component disposed over and covering the ambient light sensor and the light detector, and a molded infrared light cut component disposed over and between the first and second molded infrared light pass components and over portions of the substrate, the molded infrared light cut component having first, second and third apertures disposed therethrough above the light emitter, the ambient light sensor, and the light detector, respectively.

In other embodiments, there is provided a method of making an optical proximity sensor comprising mounting an infrared light emitter atop a substrate comprising a plurality of wire bond pads and electrically connecting the light emitter to at least one of the wire bond pads, mounting a light detector atop the substrate and electrically connecting the light detector to at least one of the wire bond pads, mounting an integrated circuit atop the substrate, the integrated circuit comprising light emitter driving and light detecting circuits operably connected to the light emitter and the light detector, respectively, and electrically connecting the integrated circuit to some of the plurality of wire bond pads, mounting at least one spacer comprising an electrically non-conductive dielectric material to a top surface of the integrated circuit, mounting an ambient light sensor to a top surface of the spacer, and electrically connecting the ambient light sensor to at least one of the wire bond pads, mounting a light detector to the top surface of the spacer, and electrically connecting the light detector to at least one of the wire bond pads, molding or casting a first infrared light pass component over the light emitter, molding or casting a second infrared light pass component over the ambient light sensor and the light detector, and molding or casting an infrared light cut component over and between the first and second infrared light pass components and over portions of the substrate, the molded infrared light cut component having first, second and third apertures disposed therethrough above the light emitter, the ambient light sensor, and the light detector, respectively.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTIONS OF SOME PREFERRED EMBODIMENTS

In the following Detailed Description, reference is made to the accompanying drawings, which form a part hereof, and in which are illustrated specific embodiments according to which the invention may be practiced. In this regard, directional terminology, such as "top," "bottom," "atop," "beneath," "forward," "backward," "side," "front," "back," etc., is used with reference to the orientation of the Figures being described. Because the components of various embodiments of the invention may be positioned in a number of different orientations, the directional terminology is used for purposes of illustration and is in no way limiting. It is to be understood that other embodiments may be utilized, and that structural or logical changes may be made without departing from the scope of the present invention. The following Detailed Description, therefore, is not to be taken in a limiting sense, and the scope of the present invention is is defined by the appended claims.

Figure 9:
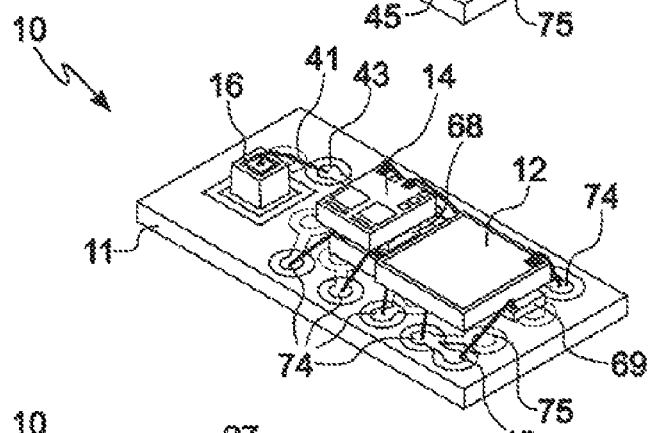
Figure 10:
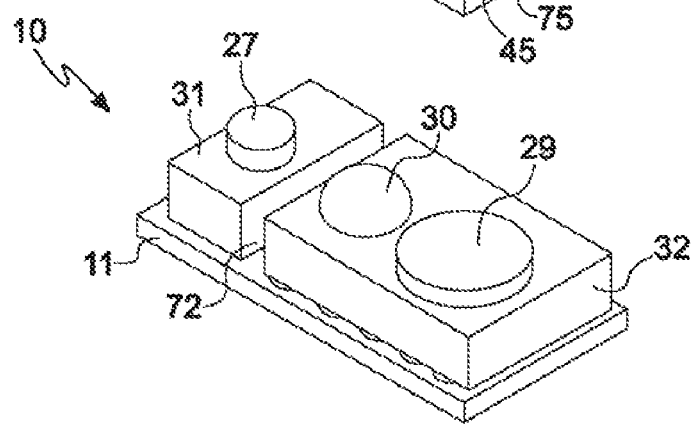
Figure 11:
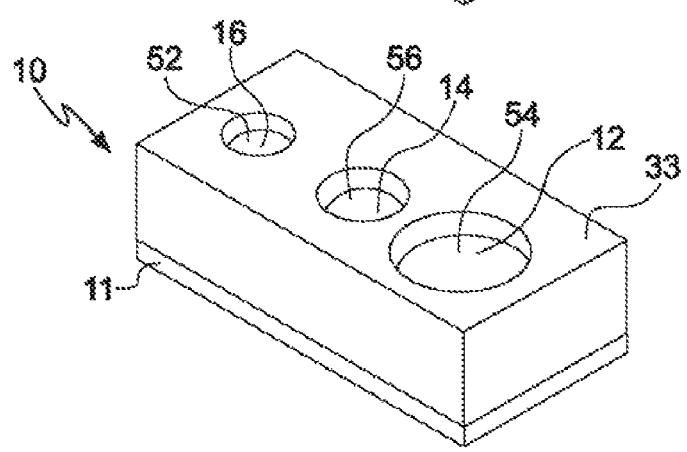
Figure 12:
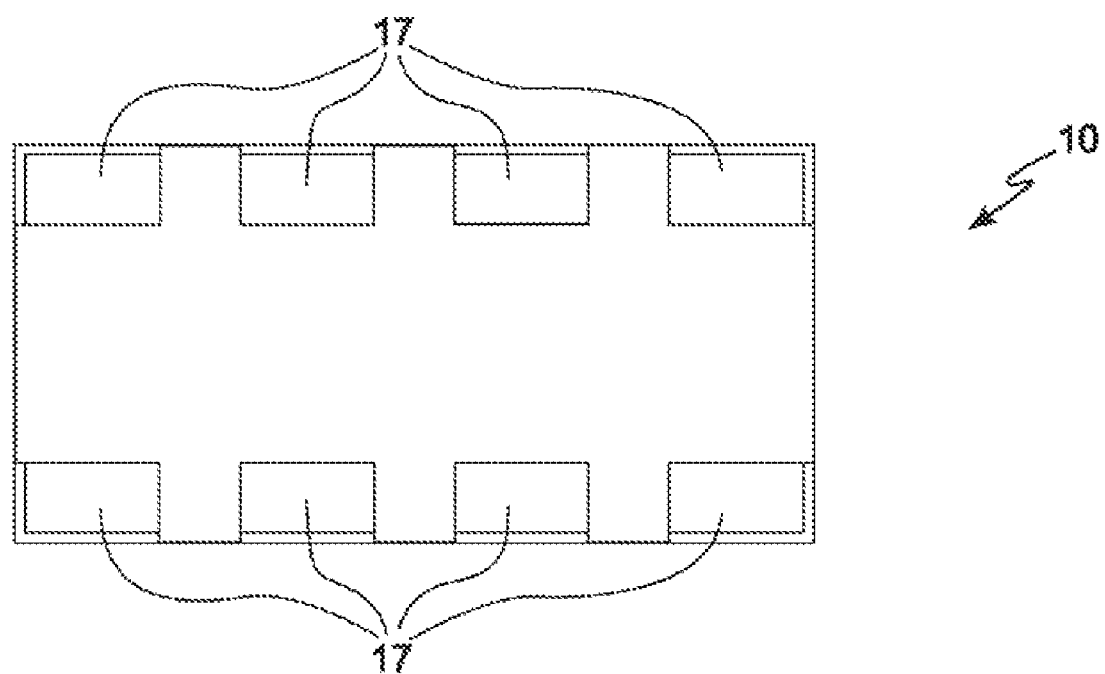
FIG. 12 shows a bottom plan view of the optical proximity sensor of FIG. 11.

Referring now to FIGS. 3 through 12, there is shown one embodiment of optical proximity sensor 10 and its various components during various stages of assembly. The complete optical proximity sensor of such an embodiment is shown in FIGS. 11 and 12. As will become apparent, the embodiment of optical proximity sensor 10 shown in FIGS. 11 and 12 overcomes many of the problems associated with prior art optical proximity sensors by completely eliminating the need for a metal shield, reducing the overall size, volume and footprint of optical proximity sensor 10, reducing crosstalk between the light emitter and the light detector, and reducing manufacturing and material costs associated therewith. For example, in one embodiment optical sensor 10 shown in of FIGS. 11 and 12 may be configured to have dimensions of about 4.0 mm×2.0 mm×1.2 mm. Many other advantages of the embodiment of the optical proximity sensor 10 illustrated in FIGS. 3 though 12 will become apparent to those skilled in the art upon having read, understood and considered the present specification and drawings.

Figure 1:
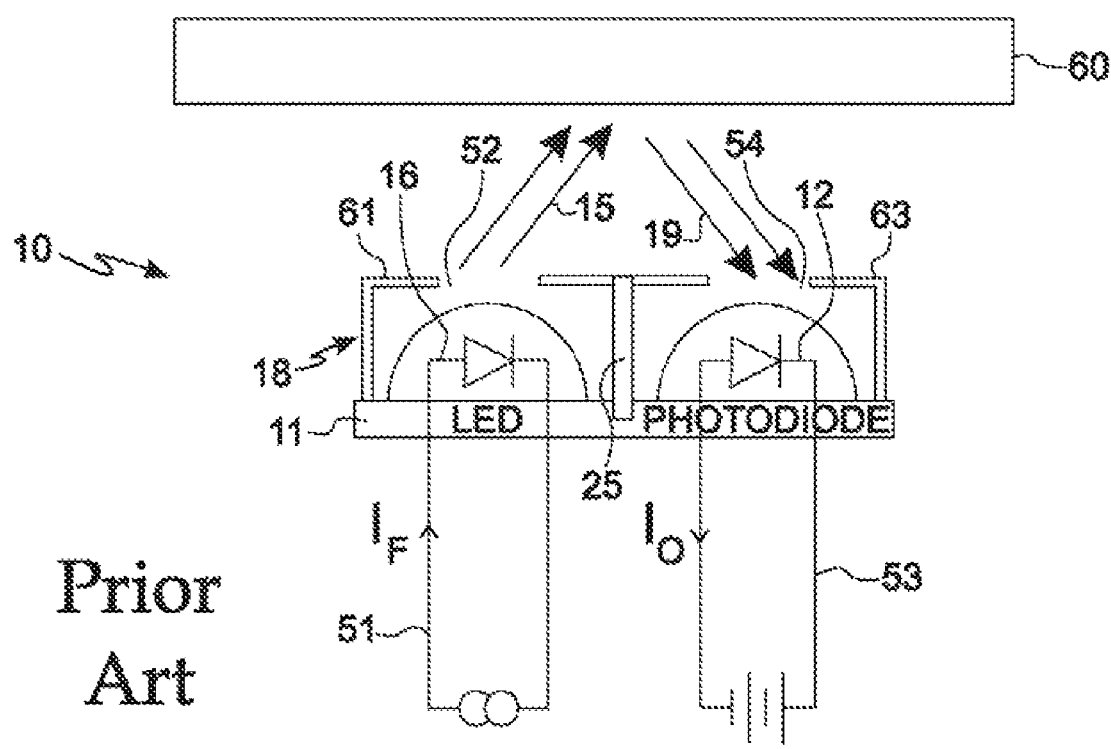
FIG. 1 shows a prior art optical proximity sensor and associated circuitry.
Figure 2:
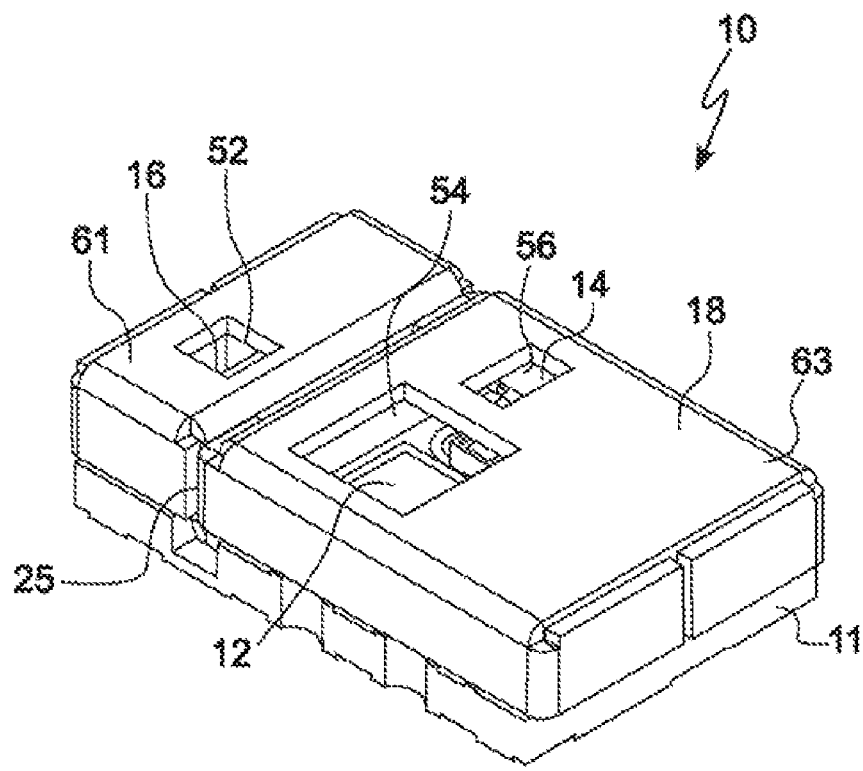
FIG. 2 shows a perspective view of an assembled prior art optical proximity sensor.
Figure 3:
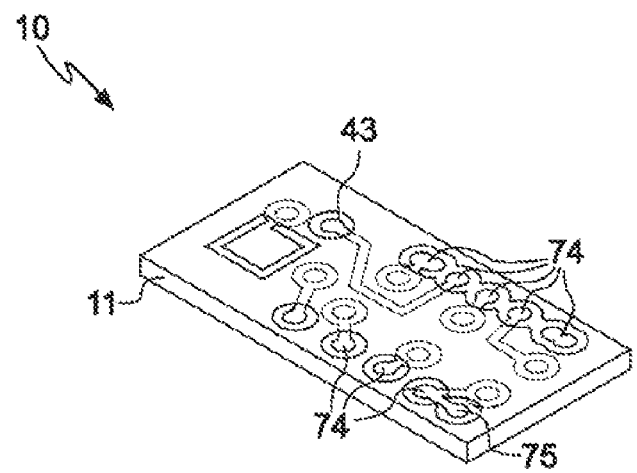
FIGS. 3 through 6 show top perspective views of one embodiment of an optical proximity sensor during various initial stages of assembly.

Referring now to FIG. 3, there is substrate 11 having a plurality of wire bond pads 43, 74 and 75 disposed or formed thereon. Conventional materials well known to those skilled in the art may be employed to form first substrate 11, such as printed circuit board (PCB) material. In one embodiment, substrate 11 is a printed circuit board having traces, wire bond pads and/or vias disposed thereon or therein.

Figure 4:
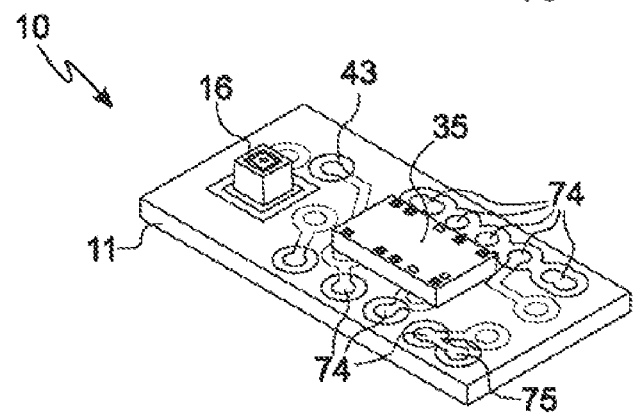
Figure 5:
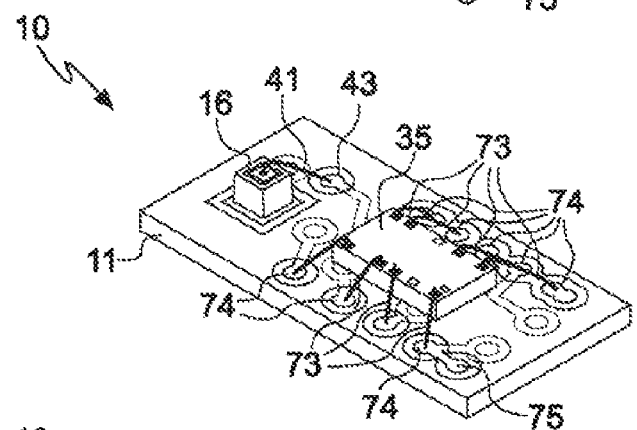

FIG. 4 shows light emitter 16 and integrated circuit 35 mounted or die attached to substrate 11. In FIG. 5, light emitter 16 is operably connected to one of wire bond pads 43 via wire 41. According to one embodiment, light emitter 16 is a is semiconductor infrared LED such as a Model No. TK116IRA TYNTEK™ AlGaAs/GaAs Infrared Chip, the data sheet for which is included in an Information Disclosure Statement filed on even date herewith and the entirety of which is hereby incorporated by reference herein. According to one embodiment, integrated circuit 35 is an AVAGO TECHNOLOGIES™ APDS-9700 signal conditioning IC for optical proximity sensors, the data sheet for which is hereby incorporated by reference herein in its entirety.

Figure 6:
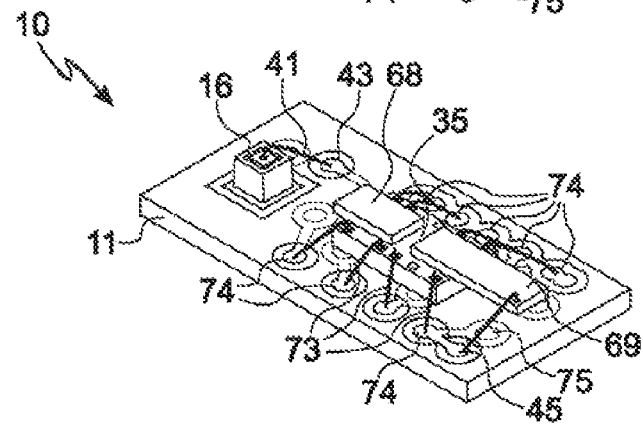
Figure 7:
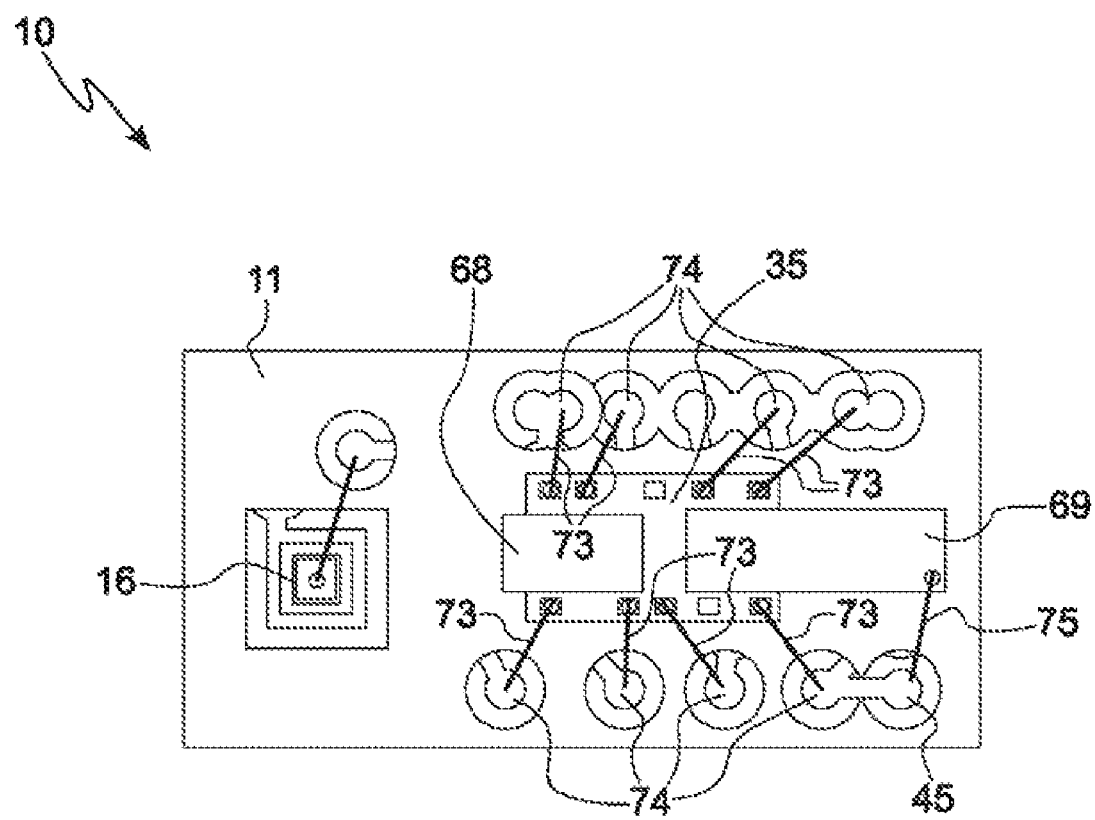
FIG. 7 shows a top plan view of the optical proximity sensor of FIG. 6.

FIGS. 6 and 7 show first and second spacers 68 and 69 mounted on a top surface of integrated circuit 35. FIG. 6 is a top perspective view of sensor 10, while FIG. 7 is a top view of sensor 10. Spacers 68 and 69 may be attached to the top surface of integrated circuit 35 using, by way of example, electrically non-conductive epoxy. Other means and materials for attaching or securing first and second spacers 68 and 69 to integrated circuit 35 are also contemplated. First and second spacers may be formed of an electrically non-conductive dielectric material such as silicon or a semiconductor material. Other suitable materials for spacers 68 and 69 are also contemplated, such as ceramic, electrically non-conductive polymers and PCB materials. In one embodiment, a top surface or portion of second spacer 69 is coated with an electrically conductive metal such as aluminum to facilitate electrical connection between light detector 12 and one or more wire bond pads on substrate 11. Note ground wire 75 which connects a metal-coated portion of second spacer 69 to wire bond pad 45 on substrate 11. In one embodiment spacers 68 and 69 are not separated from one another and instead form a single spacer. More than two spacers may also be employed.

Figure 8:
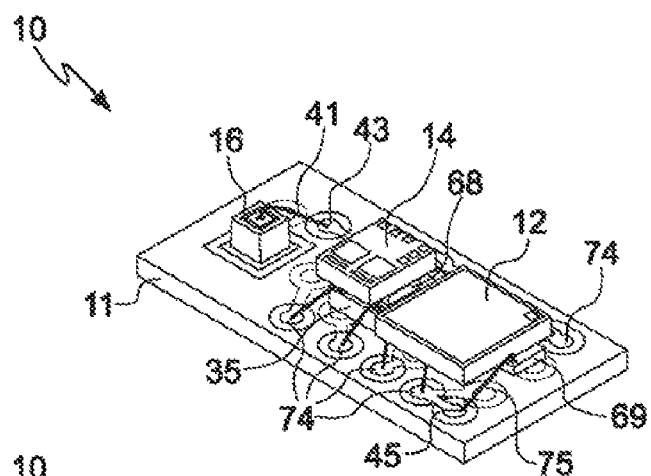
FIGS. 8 through 11 show top perspective views of one embodiment of an optical proximity sensor during various later stages of assembly.

FIGS. 8 and 9 show sensor 10 with ambient light sensor 14 mounted atop first spacer 68 and light detector 12 mounted atop second spacer 69. Ambient light sensor 14 and light detector 12 may be attached to the top surfaces of first and second spacers using, by way of example, electrically non-conductive epoxy or electrically conductive epoxy, depending on the specific electrical configuration that is to be employed. Other means and materials for attaching or securing ambient light sensor 14 and light detector 12 to first and second spacers 68 and 69 are also contemplated. According to one embodiment, light detector 12 is an ASIC such as an AVAGO TECHNOLOGIES™ APDS-9120 integrated optical proximity sensor and ambient light detector 14 is AVAGO TECHNOLOGIES™ APDS-9800 integrated ambient light and proximity sensor.

FIG. 10 shows sensor 10 after a first molded optically transmissive infrared light pass component 31 has been disposed over and covers light emitter 16. Note that first molded optically transmissive infrared light pass component 31 may be shaped to include lens 27, as shown in FIG. 10, lens 28 being configured to collimate and direct light emitted by light emitter 16 outwardly away from light emitter 16 towards object to be detected 60 (not shown in FIG. 10).

Continuing to refer to FIG. 10, there is shown sensor 10 after second molded optically transmissive infrared light pass component 32 has been disposed over and covers light detector 12 and ambient light detector 14. Note that second molded optically transmissive infrared light pass component 32 may be shaped to include lenses 29 and 30 as shown in FIG. 10, where lens 29 is configured to collimate and direct light reflected from object to be detected 60 (not shown in FIG. 10) inwardly towards light detector 12. Optical lenses 27, 29 and 30 of FIG. 10 are preferably formed of the same material, and formed at the same time during the manufacturing process, as first and second molded optically transmissive infrared light pass components 31 and 32, and are operably disposed over light emitter 16, light detector 12 and ambient light detector 14, respectively, as shown in FIG. 10. Channel 72 located between first and second molded optically transmissive infrared light pass components 31 and 32 may be formed by simply molding components 31 and 32 separately, or by cutting or sawing through the optically transmissive infrared light pass material located between components 31 and 32 after the molding or casting step associated with the optically transmissive infrared light pass material has been completed.

FIG. 11 shows optical sensor 10 after infrared light cut component 33 has been molded over first and second molded optically transmissive infrared light pass components 31 and 32, as well as over the periphery of substrate 11. Note that apertures 52, 56 and 54 are disposed through infrared light cut component 33 to permit light to be emitted through aperture 52 by light emitter 16, ambient light to fall on ambient light sensor 12, and light reflected from object to be detected 60 to pass through aperture 54 for incidence upon light detector 12. Infrared light cut component 33 extends and is molded between first and second molded optically transmissive infrared light pass components 31 and 32 so as to attenuate or absorb undesired scattered, reflected or direct light rays that might otherwise propagate between light emitter 16 and light detectors 12 and 14. That is, infrared light cut component 33 is configured and molded to substantially attenuate or block the transmission of undesired direct, scattered or reflected light between to light emitter 16 and light detector 12, and thereby minimize optical crosstalk and interference between light emitter 16 and light detector 12.

FIG. 12 shows a bottom view of fully assembled sensor 10. Electrical contacts 17 permit the operable connection of sensor 10 to other devices, such as a portable electronic device into which sensor 10 is incorporated.

Infra-red rays emitted by light emitter or LED 16 exit sensor 10 and return to light detector 12 as rays, thereby permitting detection of object to be detected 60. Light rays internally reflected from the top or side surfaces of molded component 31 are blocked from reaching light detector 12 by molded substantially optically non-transmissive infrared light cut component 33. Light rays reflected from a window interposed between optical sensor 10 and object to be detected 60 are also blocked by molded substantially optically non-transmissive infrared light cut component 33. Total Internal Reflection between components 31, 32 and 33 helps improve the performance of proximity sensor 10. As will now be seen, the embodiment of sensor 10 shown in FIGS. 3 through 12 eliminates the need to provide a metal shield, while improving the optical performance of sensor 10 by reducing crosstalk and interference, as undesired reflected, refracted or diffracted light rays cannot penetrate and travel through to light detectors 12 or 14. Moreover, sensor 10 has a very small footprint and device volume. Indeed, sensor 10 shown in FIGS. 11 and 12 yields a surprising footprint that is about 85% smaller than that of AVAGO TECHNOLGIES' first-generation APDS-9800 Integrated Proximity Sensor.

According to one embodiment, first and second molded optically transmissive infrared light pass components 31 and 32 are formed using an infrared-pass and optically transmissive transfer molding compound such as NITTO DENKO™ NT-8506 clear transfer molding compound 8506 or PENCHEM Technologies™ OP 579 infrared pass optoelectronic epoxy. Other suitable optically transmissive epoxies, plastics, polymers or other materials may also be employed. In some embodiments, and as discussed in further detail below, optically transmissive infrared light pass components 31 and 32 are molded during the same manufacturing step, or may be molded separately. See Technical Data Sheet NT-8506 entitled "Clear Transfer Molding Compound NT-8506" dated 2001 and PENCHEM OP 579 IR Pass Optoelectronic Epoxy Data Sheet, Revision 1, dated April, 2009, both of which documents are hereby incorporated by reference herein, each in its respective entirety.

In one embodiment, molded substantially optically non-transmissive infrared light cut component 33 is formed using an infrared-blocking, filtering or cutting transfer molding compound such as NITTO DENKO™ NT-MB-IRL3801 two-part epoxy resin material, NITTO DENKO™ NT8570 material, or PENCHEM Technologies™ OP 580 infrared filter optoelectronic epoxy, either of which preferably contains an amount of an infrared cutting material that has been selected by the user to achieve acceptable infrared light blocking performance while minimizing the amount of such infrared cutting material employed to keep costs to a minimum. Other suitable optically non-transmissive epoxies, plastics, polymers or other materials may also be employed. See Technical Data Sheet NT-MB-IRL3801 published by DENKO™ dated 2008 and PENCHEM OP 580 IR Filter Optoelectronic Epoxy Data Sheet, Revision 1, dated April, 2009, both of which documents are hereby incorporated by reference herein, each in its respective entirety.

Figure 13:
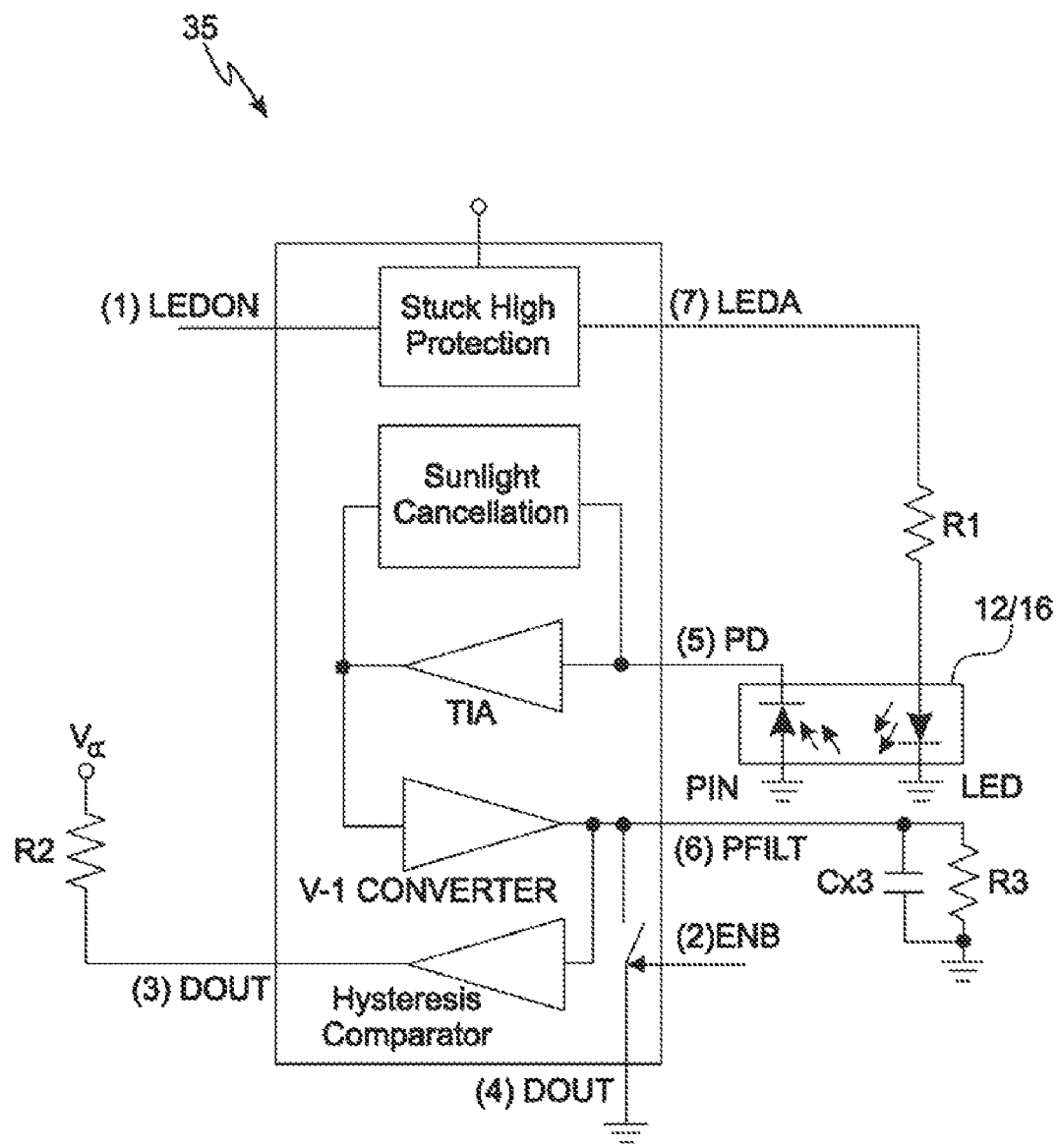
FIG. 13 shows one embodiment of circuitry for integrated circuit 35 and optical proximity sensor 10.

FIG. 13 shows one embodiment of circuitry associated with integrated circuit 35 and proximity sensor 10, which in the illustrated embodiment is an Avago Technologies APDS 9700 signal conditioning integrated circuit. Other embodiments of such circuitry are contemplated.

Figure 14:
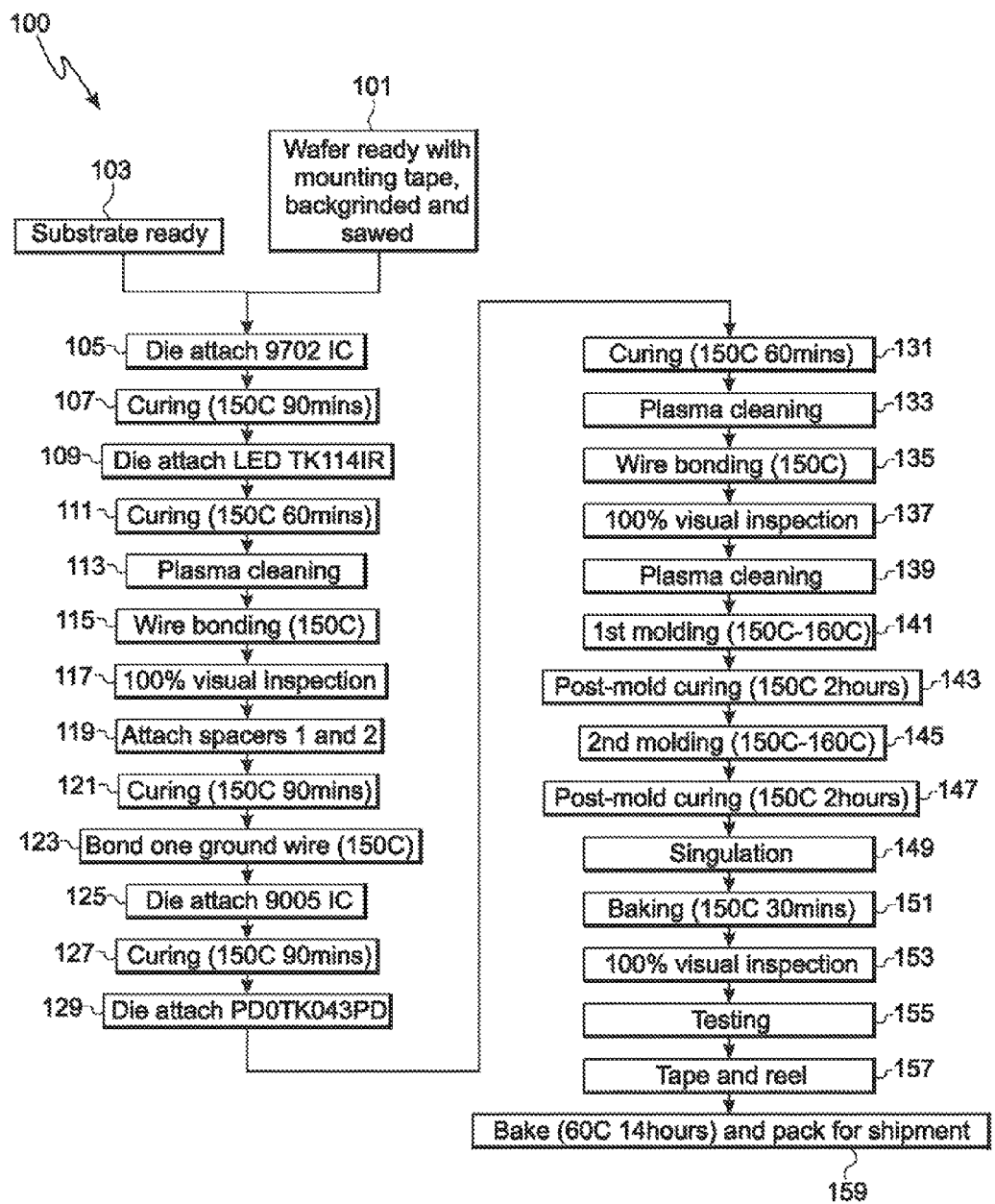
FIG. 14 shows one embodiment of method 100 for making optical proximity sensor 10.

FIG. 14 illustrates one embodiment of method 100 for making proximity sensor 10 of FIGS. 11 and 12. Method 100 begins by preparing and providing substrate 11 at step 103, and at step 101 preparing and providing semiconductor wafers containing integrated circuits 35 (Avago Technologies 9702 IC), LEDs 16 (LED TK114IR), light detectors 12 (PD-TK043PD), and ambient light sensors 14 (Avago Technologies 9005IC), which are mounted on blue tape, backgrinded and diced. Individual dice 35 (9702 ICs) are attached to substrates 11 in step 105 using an electrically non-conductive epoxy such ABLESTIK™ 2025. The epoxy is cured in step 107. Next, individual dice 12 (PD-TK043PD) are attached to substrates 11 in step 109 using an electrically conductive epoxy such as FDP5053 or FDP5100. The epoxy is cured in step 111. After die attachment, plasma cleaning is conducted at step 113 to clean the surfaces of substrates 11, and especially the wire bonding surfaces thereof, before wire bonding is conducted at step 115. After wire bonding, 100% visual inspection is conducted at step 117 to verify bond quality and integrity. First or dummy spacers 68 are then attached to the top surfaces of integrated circuits 35 using an electrically non-conductive epoxy such ABLESTIK™ 2025. Second aluminum coated spacers 69 are then attached to the top surfaces of integrated circuits 35 using an electrically non-conductive epoxy such ABLESTIK™ 2025. At epoxy is cured at step 121. (Alternatively, the epoxy applied to first spacers 68 may be cured before attaching second spacers 69 to integrated circuits.) At step 123 ground wires are wire-bonded to the aluminum-coated portions of second spacers 69 and to corresponding wire bond pads 45 on substrates 11. Next, individual dice 14 (9005 ICs) are attached to substrates 11 in step 125 using an electrically non-conductive epoxy such ABLESTIK™ 2025. The epoxy is cured in step 127. Individual dice 12 (PD-TK043PD) are then attached to substrates 11 in step 129 using an electrically conductive epoxy such as FDP5053 or FDP5100. The epoxy is cured in step 131. After die attachment, plasma cleaning is conducted at step 133 to clean the surfaces of substrates 11, and especially the wire bonding surfaces thereof, before wire bonding is conducted at step 135. After visual inspection, a second plasma cleaning step 129 is conducted. Next, a first transfer molding process is conducted at step 141 using NT8506 clear or infrared pass compound, followed at step 143 by post-mold curing. A second transfer molding process is conducted at step 145 using NT8570 infrared cut compound, followed at step 147 by post-mold curing. After curing, substrates 11 are diced and singulated at step 149, which are then baked at step 151. After baking, 100% visual inspection is conducted at step 153. Electrical testing is performed on individual sensors 10 at step 155. After testing, individual sensors 10 that have passed the electrical tests performed at step 155 are placed on tapes and reels at step 157, and then baked and packed for shipment at step 159.

Note that other many methods for making optical proximity sensor 10 are also contemplated, and that the order of the steps shown in FIG. 14 may be changed.

The transfer molding processes described above include methods where thermosetting materials are softened by heat and pressure in a transfer chamber, and then forced at high pressure through suitable sprues, runners, and gates into a closed mold for final curing. Casting, injection molding and other suitable methods and processes may also be employed to form components 31, 32 and 33.

Included within the scope of the present invention are methods of making and having made the various components, devices and systems described herein.

Those skilled in the art will understand that the various embodiments of the proximity sensor disclosed herein may be incorporated into portable electronic devices such as mobile telephones, smart phones, personal data assistants (PDAs), laptop computers, notebook computer, computers and other devices.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. An optical proximity sensor, comprising:
   a substrate comprising a plurality of wire bond pads;
   an infrared light emitter mounted atop the substrate and electrically connected to at least one of the wire bond pads;
   a light detector mounted atop the substrate and electrically connected to at least one of the wire bond pads;
   an integrated circuit mounted atop the substrate, the integrated circuit comprising light emitter driving and light detecting circuits operably connected to the light emitter and the light detector, respectively, the integrated circuit being operably connected to some of the plurality of wire bond pads;
   at least one spacer comprising an electrically non-conductive dielectric material, the spacer being mounted to a top surface of the integrated circuit;
   an ambient light sensor mounted to a top surface of the spacer, the ambient light sensor being electrically connected to at least one of the wire bond pads, wherein the light detector is mounted to the top surface of the spacer;
   a first molded infrared light pass component disposed over and covering the light emitter;
   a second molded infrared light pass component disposed over and covering the ambient light sensor and the light detector, and
   a molded infrared light cut component disposed over and between the first and second molded infrared light pass components and over portions of the substrate, the molded infrared light cut component having first, second and third apertures disposed therethrough above the light emitter, the ambient light sensor, and the light detector, respectively.

2. The optical proximity sensor of claim 1, wherein at least a first portion of light emitted by the light emitter passes through the first component and the first aperture, and at least a second portion of the first portion of light reflected from an object of interest in proximity to the sensor passes through the third aperture and the second component for detection by the light detector, and the infrared light cut component substantially attenuates or blocks the transmission of undesired direct, scattered or reflected light between the light emitter and the light detector and thereby minimizes optical crosstalk and interference between the light emitter and the light detector.

3. The optical proximity sensor of claim 1, wherein at least one of the first and second infrared light pass components comprises an optically transmissive epoxy, polymer or plastic.

4. The optical proximity sensor of claim 1, wherein the infrared light cut component comprises a substantially optically non-transmissive moldable material, epoxy, polymer or plastic.

5. The optical proximity sensor of claim 1, wherein the infrared light cut component further comprises an infrared cut or blocking additive.

6. The optical proximity sensor of claim 1, wherein the substrate is a printed circuit board ("PCB").

7. The optical proximity sensor of claim 1, wherein at least one of the light emitter, the ambient light sensor and the light detector is a semiconductor die.

8. The optical proximity sensor of claim 1, wherein the integrated circuit is an application specific integrated circuit ("ASIC").

9. The optical proximity sensor of claim 1, wherein the at least one spacer comprises first and second spacers separated from one another atop the integrated circuit, the ambient light sensor being mounted atop the first spacer and the light detector being mounted atop the second spacer.

10. The optical proximity sensor of claim 9, wherein at least portions of the second spacer are coated with an electrically conductive metal.

11. The optical proximity sensor of claim 1, wherein the at least one spacer comprises silicon or a semiconductor material.

12. The optical proximity sensor of claim 11, wherein the portable electronic device is a smart phone, a mobile telephone, a personal data assistant (PDA), a laptop computer, a notebook computer, or a computer.

13. The optical proximity sensor of claim 1, wherein the optical proximity sensor is incorporated into a portable electronic device.

14. The optical proximity sensor of claim 1, wherein the light emitter is an LED.

15. The optical proximity sensor of claim 1, wherein the light detector is a positive-intrinsic-negative ("PIN") diode.

16. The optical proximity sensor of claim 1, wherein a molded optically transmissive lens is formed over at least one of the light emitter, the ambient light sensor and the light detector.

17. A method of making an optical proximity sensor, comprising:
mounting an infrared light emitter atop a substrate comprising a plurality of wire bond pads and electrically connecting the light emitter to at least one of the wire bond pads;
mounting a light detector atop the substrate and electrically connecting the light detector to at least one of the wire bond pads;
mounting an integrated circuit atop the substrate, the integrated circuit comprising light emitter driving and light detecting circuits operably connected to the light emitter and the light detector, respectively, and electrically connecting the integrated circuit to some of the plurality of wire bond pads;
mounting at least one spacer comprising an electrically non-conductive dielectric material to a top surface of the integrated circuit;
mounting an ambient light sensor to a top surface of the spacer, and electrically connecting the ambient light sensor to at least one of the wire bond pads, wherein the mounting of the light detector includes mounting the light detector to the top surface of the spacer;
molding or casting a first infrared light pass component over the light emitter;
molding or casting a second infrared light pass component over the ambient light sensor and the light detector, and
molding or casting an infrared light cut component over and between the first and second infrared light pass components and over portions of the substrate, the molded infrared light cut component having first, second and third apertures disposed therethrough above the light emitter, the ambient light sensor, and the light detector, respectively.

18. The method of claim 17, further comprising configuring the light detector and the light emitter with respect to one another such that at least a first portion of light emitted by the light emitter passes through the first component and the first aperture and at least a second portion of the first portion of light reflected from an object of interest in proximity to the sensor passes through the third aperture for detection by the light detector.

19. The method of claim 17, further comprising configuring the infrared light cut component to substantially attenuate or block the transmission of undesired direct, scattered or reflected light between the light emitter and the light detector thereby to minimize optical crosstalk and interference between the light emitter and the light detector.

20. The method of claim 17, further comprising forming optically transmissive lenses over the light emitter, the ambient light sensor and the light detector when the first and second optically transmissive infrared light pass components are molded or casted.

21. The method of claim 17, wherein the light emitter or the light detector is die-attached to the substrate.

22. The method of claim 17, wherein the first and second optically transmissive infrared light pass components are casted or transfer-molded.

23. The method of claim 17, wherein the first and second optically transmissive infrared light pass components are casted or transfer-molded at the same time and later separated by a channel sawn or cut therebetween.

24. The method of claim 17, wherein the at least one spacer further comprises first and second spacers separated from one another atop the integrated circuit, the ambient light sensor being mounted atop the first spacer and the light detector being mounted atop the second spacer.

25. The method of claim 24, wherein at least portions of the second spacer are coated with an electrically conductive metal.

26. The method of claim 17, wherein the at least one spacer comprises silicon or a semiconductor material.

27. The method of claim 17, further comprising incorporating the optical proximity sensor into a portable electronic device.

28. The method of claim 27, wherein the portable electronic device is a smart phone, a mobile telephone, a personal data assistant (PDA), a laptop computer, a notebook computer, or a computer.

* * * * *